United States Patent
Brettschneider et al.

(10) Patent No.: US 9,149,804 B2
(45) Date of Patent: Oct. 6, 2015

(54) MICROFLUIDIC DEVICE AND METHOD FOR PRODUCING A MICROFLUIDIC DEVICE

(75) Inventors: Thomas Brettschneider, Leonberg (DE); Christian Dorrer, Stuttgart (DE)

(73) Assignee: Robert Bosch GmbH, Stuttgart, DE (US)

( * ) Notice: Subject to any disclaimer, the term of this patent is extended or adjusted under 35 U.S.C. 154(b) by 0 days.

(21) Appl. No.: 14/127,045

(22) PCT Filed: May 22, 2012

(86) PCT No.: PCT/EP2012/059417
§ 371 (c)(1),
(2), (4) Date: Mar. 21, 2014

(87) PCT Pub. No.: WO2013/007433
PCT Pub. Date: Jan. 17, 2013

(65) Prior Publication Data
US 2014/0227150 A1    Aug. 14, 2014

(30) Foreign Application Priority Data
Jul. 11, 2011 (DE) .................. 10 2011 078 976

(51) Int. Cl.
*B01L 3/00* (2006.01)
*B81C 1/00* (2006.01)
(Continued)

(52) U.S. Cl.
CPC ....... *B01L 3/50273* (2013.01); *B01L 3/502738* (2013.01); *B81C 1/00436* (2013.01); *B81C 99/0085* (2013.01); *B01L 2200/10* (2013.01); *B01L 2300/089* (2013.01); *B01L 2300/0874* (2013.01); *B01L 2300/0887* (2013.01); *B01L 2300/12* (2013.01); *B01L 2300/14* (2013.01); *B01L 2400/0481* (2013.01); *B01L 2400/0487* (2013.01); *B01L 2400/06* (2013.01); *B01L 2400/0638* (2013.01); *B29L 2031/7506* (2013.01); *F16K 99/0015* (2013.01); *F16K 99/0034* (2013.01); *F16K 2099/0084* (2013.01); *G01F 11/086* (2013.01); *Y10T 137/85978* (2015.04)

(58) Field of Classification Search
None
See application file for complete search history.

(56) References Cited

U.S. PATENT DOCUMENTS

2002/0141903 A1    10/2002    Parunak et al.
2003/0096423 A1*   5/2003    Ryan et al. ............ 436/164
(Continued)

FOREIGN PATENT DOCUMENTS

CN    101282789 A    10/2008
EP    2 025 405 A1    2/2009
(Continued)

OTHER PUBLICATIONS

International Search Report corresponding to PCT Application No. PCT/EP2012/059417, mailed Sep. 3, 2012 (German and English language document) (7 pages).

*Primary Examiner* — Jennifer Wecker
(74) *Attorney, Agent, or Firm* — Maginot, Moore & Beck LLP

(57) ABSTRACT

A microfluidic device includes at least two layers arranged one above the other, a membrane which is arranged between the at least two layers, a cavity in one of the at least two layers, and a channel in the other of the at least two layers. The membrane is arranged so as to be expandable between the cavity and the channel. The membrane is expandable into at least one specified displacement volume.

18 Claims, 6 Drawing Sheets

(51) Int. Cl.
  *F15C 3/00*   (2006.01)
  *B81C 99/00*   (2010.01)
  *F16K 99/00*   (2006.01)
  *G01F 11/08*   (2006.01)
  *B29L 31/00*   (2006.01)

(56) References Cited

U.S. PATENT DOCUMENTS

| | | | |
|---|---|---|---|
| 2004/0209354 A1* | 10/2004 | Mathies et al. | 435/287.2 |
| 2006/0076068 A1* | 4/2006 | Young et al. | 137/829 |
| 2007/0166199 A1 | 7/2007 | Zhou et al. | |
| 2008/0022927 A1* | 1/2008 | Zhang et al. | 117/210 |
| 2008/0101971 A1* | 5/2008 | Mayer | 417/533 |
| 2009/0170183 A1* | 7/2009 | Buchs | 435/243 |
| 2010/0077875 A1* | 4/2010 | Moles | 73/864.62 |
| 2010/0303687 A1* | 12/2010 | Blaga et al. | 422/504 |
| 2012/0275972 A1* | 11/2012 | Schoen et al. | 422/503 |
| 2012/0298233 A1* | 11/2012 | Rothacher | 137/613 |
| 2013/0061961 A1* | 3/2013 | Rapp | 137/561 A |
| 2013/0194575 A1* | 8/2013 | Lee | 356/436 |

FOREIGN PATENT DOCUMENTS

| | | |
|---|---|---|
| WO | 02/41994 A2 | 5/2002 |
| WO | 2007/109375 A2 | 9/2007 |

* cited by examiner

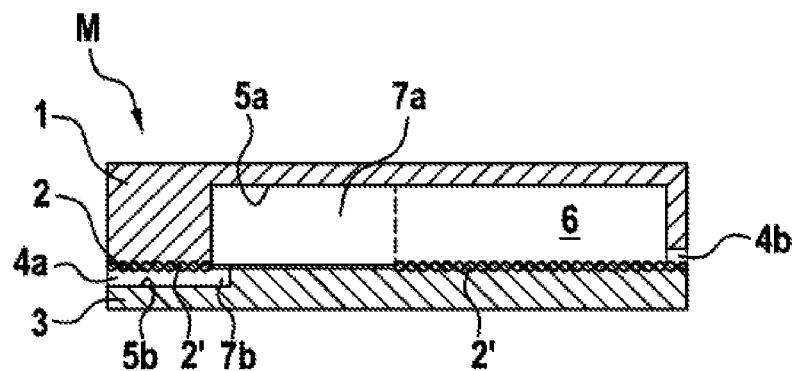
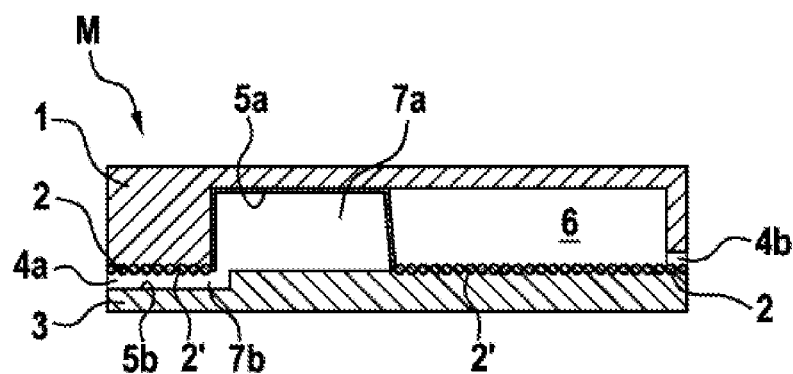

Section AA'

MICROFLUIDIC DEVICE AND METHOD FOR PRODUCING A MICROFLUIDIC DEVICE

This application is a 35 U.S.C. §371 National Stage Application of PCT/EP2012/059417, filed on May 22, 2012, which claims the benefit of priority to Ser. No. DE 10 2011 078 976.6, filed on Jul. 11, 2011 in Germany, the disclosures of which are incorporated herein by reference in their entirety.

BACKGROUND

The disclosure relates to a microfluidic device, to a method for producing a microfluidic device and to the use of a microfluidic device.

Microfluidic devices are employed, for example, as lab-on-a-chip systems within the framework of molecular-diagnostic laboratory applications. The use of microfluidic devices of this type not only makes a diagnosis possible in a large laboratory or a medical practice, but also, for example, a patient can himself or herself carry out at home appropriate checks, for example of markers or of the blood sugar level, with the aid of the microfluidic device.

Microfluidic devices of this type are produced, for example, from polymer plates with integrated ducts and/or cavities in order to transport and/or filter liquids and the like. So that the microfluidic device can be acted upon with liquids or compressed air, it can be connected to a fluid-providing device via hoses. Via the hoses, the fluid-providing device can act with pressure in a directed manner upon the ducts and/or the cavities and consequently move liquids. Furthermore, pneumatic control of microfluidic pumps and/or valves is also possible. So that individual functions of the microfluidic device can be performed in a directed manner, different pressures or pressure levels are required. These are generated outside the microfluidic device by a pneumatic device and are provided to the microfluidic device via additional connections.

A microfluidic stop valve for a microfluidic device became known from WO 2007109375 A2. The microfluidic stop valve in this case comprises an inlet, at least three diaphragm valves comprising valve inlets, valve outlets, valve controls and elastomeric diaphragms. When a valve control is acted upon with pressure or a vacuum, the elastomeric diaphragm is deflected in order to modulate a flow of a liquid. Two of the valves are connected to a third valve in such a way that a sufficiently high vacuum at an inlet of the microfluidic stop valve causes the third valve to be opened and sufficient pressure at the inlet of the microfluidic stop valve to be provided so that the third valve is closed.

US 200770166199 A1 has disclosed a microfluidic system, comprising a pneumatic multiple distributor with orifices and a chip distributor with ducts, in order to send pneumatic signals from the corresponding orifices to pressure-actuable diaphragms in a microfluidic chip. The ducts in this case transport the pneumatic signals according to a fixed configuration of the pressure-actuable diaphragms in the microfluidic chip. The microfluidic chip likewise comprises reagent reservoirs in order to store fluidic reagents and outlet stores for storage of reaction products of the fluidic reagents.

SUMMARY

The description below defines a microfluidic device, comprising at least two layers arranged one above the other, an elastic diaphragm which is arranged between the two layers, a cavity which is arranged in one of the two layers, and at least one duct in the other of the at least two layers for acting upon the diaphragm with pressure, the diaphragm being arranged so as to be expandable into at least one stipulated displacement volume.

The description below defines a method for producing a microfluidic device as described herein, at least the cavity and/or the duct being produced by means of milling, injection molding and/or hot pressing.

The description below defines the use of a microfluidic device as described herein as a lab-on-a-chip system.

The description below defines a microfluidic system having a plurality of microfluidic devices as described herein.

Different pressure levels of cavities within a microfluidic system having a plurality of microfluidic devices can be made available in a simple way by the stipulated displacement volumes, only a single pressure level having to be made available from outside for the microfluidic system or the microfluidic devices.

The fundamental idea of the present disclosure is, therefore, that, to limit the variation in pressure in the cavity in spite of a higher or lower pressure provided from outside or in spite of action upon the diaphragm with this pressure, the diaphragm admittedly expands and thus varies the pressure in the cavity, but does not do so beyond a predetermined value. As a result of the expansion of the diaphragm, the overall volume of the cavity decreases, and because of this the pressure in the cavity rises. The pressure in the cavity reached when the maximum expansion of the diaphragm is reached is in this case independent of the external pressure provided, as long as the pressure level of the external pressure is sufficiently high to deflect the diaphragm completely into a stipulated displacement volume. The pressure in the cavity upon complete expansion of the diaphragm is then constant even when the externally applied pressure fluctuates above the minimum pressure for a complete expansion of the diaphragm, for example because an external pressure generator is unstable. Thus, on the one hand, reliability in providing the pressure by the diaphragm in the cavity is increased and, on the other hand, more beneficial pressure generators for providing the external pressure for the microfluidic device are therefore also possible.

The disclosure likewise affords the advantage that an external pressure generator for providing different pressures can be dispensed with for a microfluidic system, since reduced pressures within the microfluidic system can be generated by means of the diaphragm and the cavity and by limiting means. An extremely cost-effective control of the microfluidic system and of the microfluidic device is thereby possible. The fluid-providing device can also be made substantially more compact: if a highly accurate stipulation of a specific pressure is necessary in a microfluidic system, complicated and therefore cost-intensive external pressure generators are usually required so that this accurate pressure can be provided. Owing to the limiting means, a desired pressure in the cavity can be stipulated extremely accurately, in particular via a stipulated size of the displacement volume of the diaphragm.

Furthermore, the disclosure also affords the advantage that even very low overpressures are possible simply and reliably. By a configuration of the limiting means, in particular by the limiting means making an appropriately low displacement volume available for the diaphragm, even the least possible overpressures can be provided simply and reliably. Finally, the disclosure also affords the advantage that the number of interfaces between external pressure generators and the microfluidic system can be reduced. This leads not only to a reduction in production costs, but also to a lower susceptibility to faults and to lower maintenance costs.

Further advantageous embodiments and features of the disclosure are described herein.

According to an advantageous development of the disclosure, a limiting means is arranged, which is configured to restrict the at least one displacement volume. It consequently becomes possible to define the displacement volume in a simple and reliable way.

According to a further advantageous development, the limiting means is configured to limit an expansion of the diaphragm. This ensures that a stipulated pressure level is reached simply and reliably. Thus, for example, the limiting means may be configured such as to provide as small an area as possible between the cavity and duct in the event of maximum expansion of the diaphragm. This avoids the situation where, for example because of a higher pressure, the diaphragm expands further and the pressure level in the cavity is thus increased.

According to a further advantageous development, the limiting means is configured as a clearance, in particular as a stop, in at least one of the two layers. Simple and cost-effective production of the microfluidic device and of the limiting means is thereby possible.

According to a further advantageous development, the limiting means is formed by extending the fixing of the diaphragm on at least one of the at least two layers. The advantage thus achieved is that the displacement volume can therefore be varied or adapted to current boundary conditions even during the production of the microfluidic device. Extremely flexible production of the microfluidic device is consequently made possible.

According to a further advantageous development, a connecting duct is arranged between the cavity and at least one displacement volume. When the diaphragm, which is fixed essentially to at least one of the two layers, is acted upon with pressure, it expands into the predetermined displacement volume. In this case, it is possible that the fixing is subjected to high stress as a result of multiple deflection of the diaphragm and therefore the diaphragm comes loose at least partially from the at least one layer. The arrangement of a duct appreciably increases the reliability of the fixing of the diaphragm, since the connecting duct provides a contraction which counteracts the possibility of the diaphragm coming loose from the at least one layer.

According to a further advantageous development of the disclosure, the connecting duct is formed by at least one web. The advantage thereby achieved is that the risk of the diaphragm coming loose or lifting off is consequently reduced considerably. This increases the service life of the microfluidic device. In addition, a connecting duct can also be provided cost-effectively by means of the web.

According to a further advantageous development, at least one of the displacement volumes is configured as a duct. Especially simple manufacture of the microfluidic device is consequently possible, since only a single region has to be provided for the duct and displacement volume in the at least one layer.

According to a further advantageous development of the disclosure, the clearance comprises rounded edges. This ensures that, on the one hand, the elastic diaphragm can displace the entire displacement volume, defined by the limiting means, and at the same time the risk of damage to the diaphragm during its repeated actuation is correspondingly reduced.

According to a further advantageous development, a further layer is formed as a covering layer at least for the cavity. The cavity can thus be produced especially simply by removing the second layer for the cavity. The covering layer then makes it possible to cover the cavity, so that the latter is closed, pressure-tight, by the covering layer.

According to a further advantageous development of the disclosure, at least one of the layers is produced from a polymer, in particular a thermoplastic, and/or the diaphragm is produced from a thermoplastic elastomer and/or a thermoplastic. The advantage achieved thereby is that it becomes possible to have simple and cost-effective production of the microfluidic device and a sufficient service life of the diaphragm with, at the same time, cost-effective production. In particular thermoplastics, for example PC, PT, PE, PMMA, COP, COC and the like, may be used as polymer.

According to a further advantageous development of the method for producing a microfluidic device as described herein, the at least two layers are firmly connected to one another by means of laser irradiation welding, ultrasonic welding and/or by means of an adhesive method. Joining together the layer set-up of the microfluidic device can thus take place reliably and cost-effectively.

Further, by means of the microfluidic device, it is also possible to provide vacuums in the cavity. In this case, the displacement volume, in particular the limiting means for limiting the expansion of the diaphragm, is provided on that side of the diaphragm which faces away from the cavity, for example on the side of the duct.

BRIEF DESCRIPTION OF THE DRAWINGS

Further features and advantages of the disclosure may be gathered from the following description of exemplary embodiments with reference to the drawings in diagrammatic form in which:

FIG. 2a shows a microfluidic device according to a second embodiment;

FIG. 2b shows a microfluidic device according to the second embodiment with the action of pressure upon the diaphragm;

DETAILED DESCRIPTION

FIG. 1 shows a microfluidic device according to a first embodiment in a top view and in cross section.

Figure 1A:
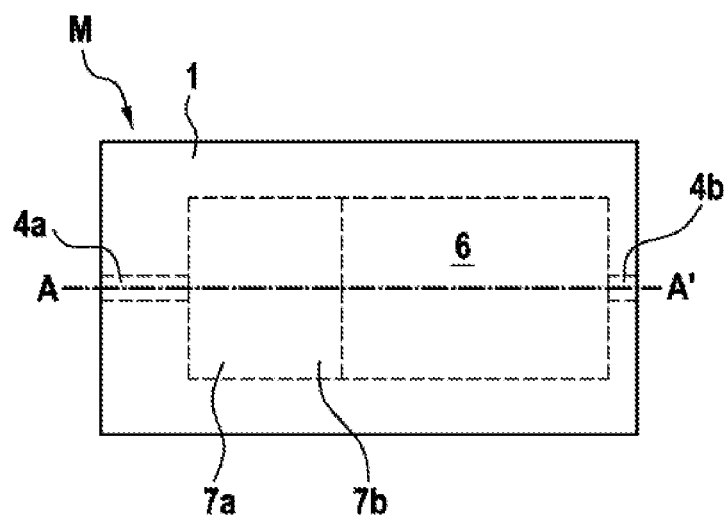
FIG. 1a shows a microfluidic device according to a first embodiment of the present disclosure in a top view.
Figure 1B:
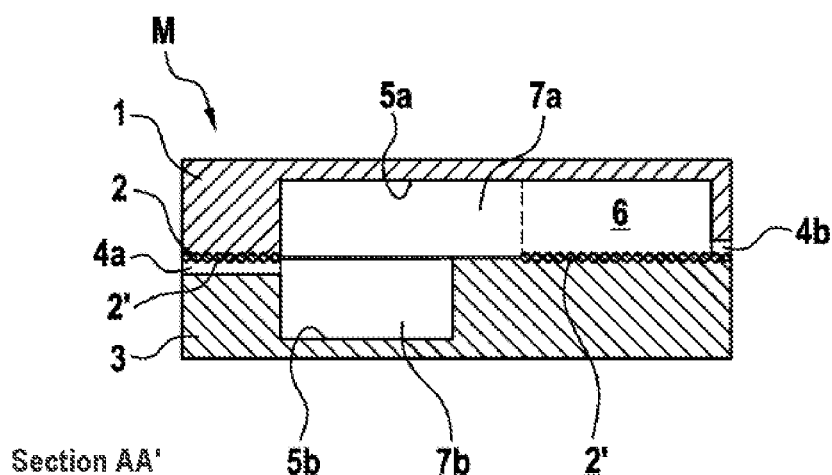
FIG. 1b shows a microfluidic device according to the first embodiment in cross section.

In FIGS. 1a and 1b, reference M denotes a microfluidic device. The microfluidic device M in this case comprises as the uppermost layer, according to FIGS. 1a and 1b, an upper polymer layer 1 and also a lower polymer layer 3 (not shown in FIG. 1a). Elements in the lower polymer layer 3 are indicated in FIG. 1a by dashes. In the lower polymer layer 3, a duct 4a is arranged, which is connected pneumatically to a lower displacement volume 7b, likewise formed in the lower polymer layer 3. The lower displacement volume 7b is pneumatically connected, further, to a diaphragm 2 which is arranged between the two polymer layers 1, 3. The diaphragm 2 in this case forms essentially the second layer of the microfluidic device M. The diaphragm 2 can in this case expand essentially completely into the lower displacement volume 7b. Further, in the upper polymer layer 1, a cavity 6 is arranged, which is connected pneumatically to an upper displacement volume 7a. The upper displacement volume 7a is in this case formed as a clearance 5a in the upper polymer layer 1. The diaphragm 2 is in this case arranged between the two polymer layers 1, 3 such that the diaphragm 2 can expand into the upper displacement volume 7a or into the lower displacement volume 7b, depending on the action of pressure upon the duct 4a. When the diaphragm 2 expands into the lower displacement volume 7b arranged in the lower polymer layer 3, the pressure in the cavity 6 is reduced. When the diaphragm 2 expands into the upper displacement volume 7a of the upper polymer layer 3, the pressure in the cavity 6 is increased.

The diaphragm 2 according to FIGS. 1a and 1b is connected to the lower polymer layer 1 and the upper polymer layer 3 via a weld seam or adhesive bond 2'. In this case, the weld seam or adhesive bond 2' is arranged in the region of the duct 4a on the upper polymer layer 1 and in the region of the cavity 6 on the lower polymer layer 3. The upper displacement volume 7a is in this case determined, on the one hand, by the clearance 5a and, on the other hand, also by the extent of the weld seam or adhesive bond 2' on the lower polymer layer 3. The cavity 6 is thus formed by that part of the clearance 5a according to FIG. 1b into which the diaphragm 2 cannot expand because of the fixing to the lower polymer layer 3. The diaphragm 2 can expand completely into the lower displacement volume 7b, formed by the clearance 5b, as a result of the generation of a vacuum in the duct 4a. A further duct 4b formed in the upper polymer layer 3 is arranged at the cavity 6 and serves for connection to pneumatically actuable structural elements, such as microfluidic pumps, valves, filters, reservoirs, chambers, mixers and the like.

In general, the duct 4a is provided with pressure, by means of which the elastically formed diaphragm 2 can then expand into the upper or lower displacement volume 7a, 7b. The following then applies, according to the Boyle-Marriote Law, to the pressure in the cavity 6:

$$p_2 = \left(\frac{V_V + V_K + V_R}{V_K + V_R}\right) p_1$$

$p_2$ describing the pressure after actuation of the diaphragm 2, $p_1$ normal pressure, that is to say a pressure at which the diaphragm 2 is not expanded and/or compressed, $V_v$ the displacement volume 7a, 7b, $V_K$ the volume of the cavity 6 and $V_R$ all the remaining volumes which are connected to the cavity 6, for example the ducts 4b or the like.

FIGS. 2a and 2b show a microfluidic device according to a second embodiment without and with the action of pressure upon the diaphragm.

FIGS. 2a and 2b show essentially a similar set-up of the microfluidic device M according to FIG. 1. In contrast to FIG. 1, the lower displacement volume 7b is again formed as a clearance 5b, but as a duct portion of the duct 4a. The lower polymer layer 3 can thus be structured or produced more simply, and furthermore a space saving for the microfluidic device M is achieved, since the thickness of the lower polymer layer 3 is smaller. FIG. 2a shows the diaphragm 2 in the nonloaded state, that is to say the pressure in the duct 4a and that in the cavity 6 are essentially equal. Dashes indicate the limit between the cavity 6, into which the diaphragm 2 cannot expand, and the upper displacement volume 7a, into which the diaphragm 2 can expand when the supply duct 4a is acted upon with pressure. In the region of the cavity 6, the diaphragm 2 is fixed to the lower polymer layer 3 by means of a weld seam or adhesive bond 2', whereas, in the nonloaded state, the diaphragm 2 merely bears against the lower polymer layer 3 in the region without a weld seam or adhesive bond 2', that is to say in the region of the upper displacement volume 7a.

Figure 3:
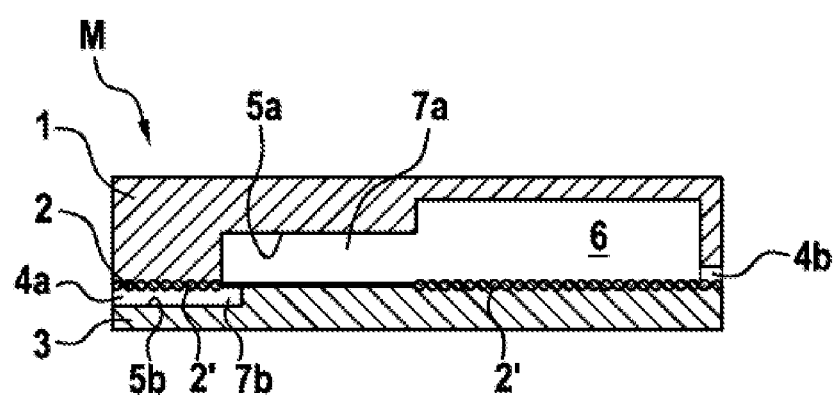
FIG. 3 shows a microfluidic device according to a third embodiment.

FIG. 3 shows a microfluidic device according to a third embodiment.

FIG. 3 shows a microfluidic device M, the set-up of which corresponds essentially to the set-up of the microfluidic device of FIGS. 2a and 2b. In contrast to FIGS. 2a and 2b, the height of the displacement volume 7a, said height being defined as the distance between the diaphragm 2 in the nonloaded state and the top edge of the clearance 5a of the displacement volume, is lower than the height of the cavity 6, which height is defined as the maximum distance between the welded-on or bonded-on diaphragm 2 and the upper polymer layer 1. It is thus possible for overpressure in the cavity 6 to be capable of being selected in a more flexible way.

Figure 4A:
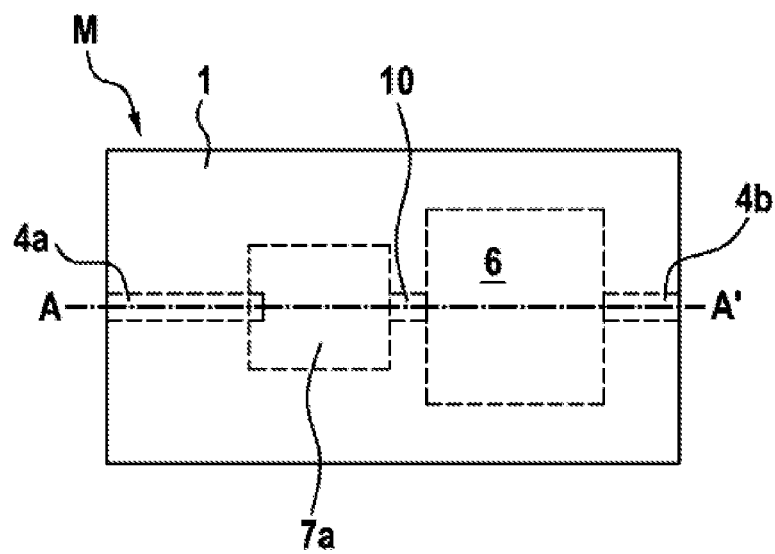
FIG. 4a shows a microfluidic device according to a fourth embodiment of the present disclosure in a top view.
Figure 4B:
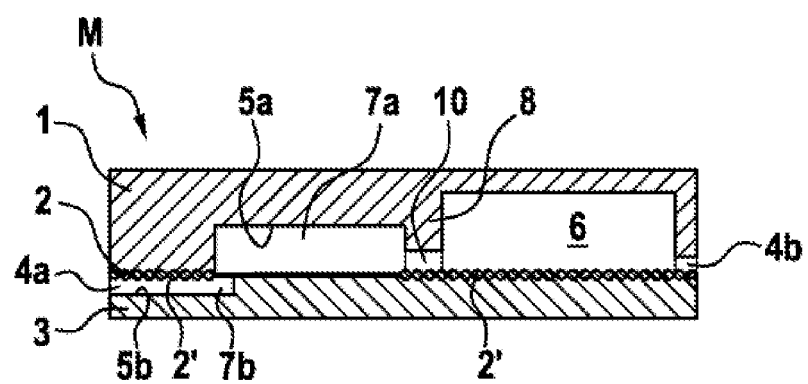
FIG. 4b shows the microfluidic device according to the fourth embodiment in cross section.

FIG. 4a and FIG. 4b show a microfluidic device according to a fourth embodiment in a top view and in cross section.

FIGS. 4a and 4b show a microfluidic device M, the set-up of which is similar to the set-up of the microfluidic device M of FIG. 3. In contrast to FIG. 3, a connecting duct 10 is formed in the region between the clearance 5a of the upper displacement volume 7a and the cavity 6. The connecting duct 10 connects the upper displacement volume 7a pneumatically to the cavity 6. The connecting duct 10 may in this case be formed by a horizontally wide web 8 which is arranged so as to project vertically downward out of the upper polymer layer 3. Loosening of the diaphragm 2 from the lower polymer layer 3 upon the repeated actuation of the diaphragm 2 is thereby reduced. The service life of the microfluidic device M is increased.

Figure 5:
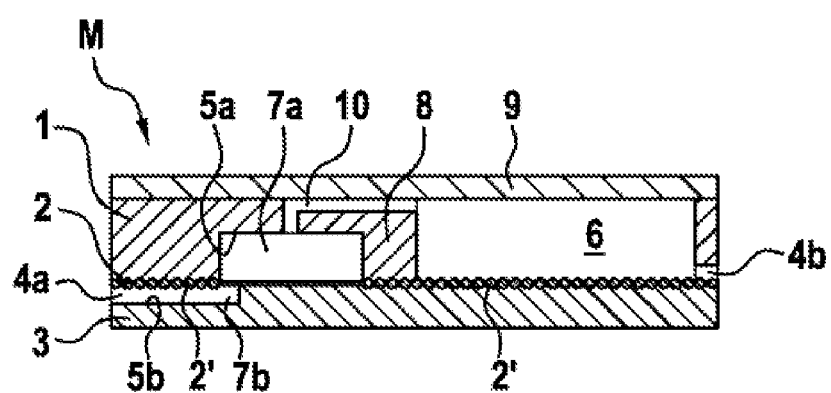
FIG. 5 shows a microfluidic device according to a fifth embodiment.

FIG. 5 shows a microfluidic device according to a fifth embodiment of the present disclosure.

FIG. 5 shows essentially a microfluidic device M set up in a similar way to FIG. 4. In contrast to FIG. 4, in FIG. 5 a covering layer 9 is arranged on the top side of the upper polymer layer 1. Further, in contrast to FIG. 4a and FIG. 4b, the web 8 is of L-shaped form and extends vertically upward from the welded-on diaphragm 2 on the lower polymer layer 1. The shorter edge of the "L" extends to the left. The height of the web 8 between the third layer 9 and the lower polymer layer 3 is lower than the height of the upper polymer layer 1, so that a connecting duct 10 is formed between the top edge of the web 8 and the third layer 9. Furthermore, the shorter leg of the "L" of the web 8 does not extend horizontally completely as far as the upper polymer layer 1, so that the connecting duct 10 is consequently formed completely between the upper displacement volume 7a and the cavity 6. The upper displacement volume 7a is formed, on the one hand, by a clearance 5a in the upper polymer layer 1 and, on the other hand, by the web 8. As a result, overall, the probability of a possible loosening of the diaphragm 2 from the lower polymer layer 2 is reduced even further.

Figure 6:
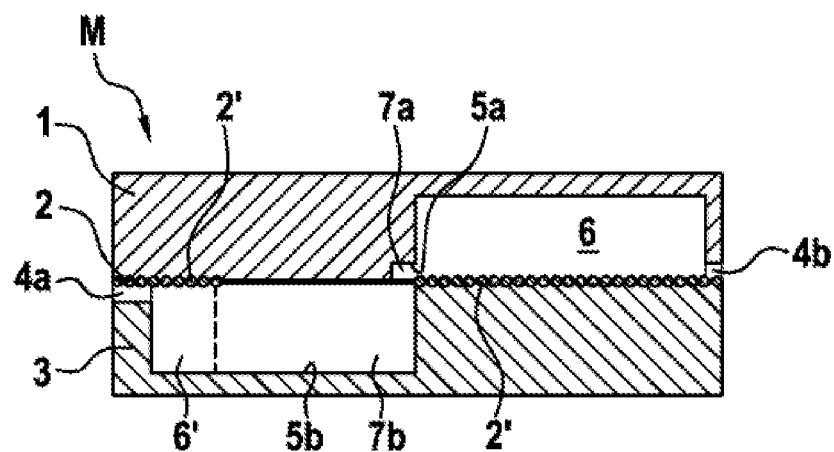
FIG. 6 shows a microfluidic device according to a sixth embodiment.

FIG. 6 shows a microfluidic device according to a sixth embodiment of the present disclosure.

FIG. 6 shows essentially a microfluidic device M according to FIGS. 2a and 2b. In contrast to FIG. 2a and 2b, the lower displacement volume 7b is in this case formed correspondingly to the upper displacement volume 7a of the microfluidic device M according to FIG. 2b. The upper displacement volume 7a is formed as a clearance 5a, but as a duct portion of a duct in the upper polymer layer 1. The upper polymer layer 1 can thus be structured or produced more simply. FIG. 6 shows the diaphragm 2 in the nonloaded state, that is to say the pressure in the duct 4a and that in the cavity 6 are essentially equal. Dashes indicate the limit between the lower displacement volume 7b, into which the diaphragm 2 can expand, and a lower volume 6', into which the diaphragm 2 cannot expand when the supply duct 4a is acted upon with pressure, and which is therefore configured essentially as a subduct of the supply duct 4a. In the region 6', the diaphragm 2 is fixed to the upper polymer layer 1 by means of a weld seam or adhesive bond 2', whereas, in the nonloaded state, the diaphragm 2 merely bears against the upper polymer layer 1 in the region without a weld seam or adhesive bond 2', that is to say the region of the lower displacement volume 7b. The microfluidic device is therefore suitable particularly for generating a vacuum in the cavity 6.

Figure 7:
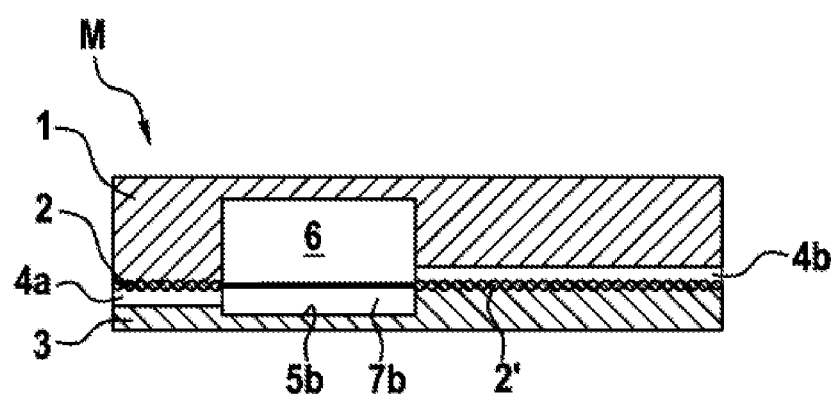
FIG. 7 shows a microfluidic device according to a seventh embodiment.

FIG. 7 shows a microfluidic device according to a seventh embodiment of the present disclosure.

FIG. 7 shows a microfluidic device essentially according to FIG. 6. In contrast to FIG. 6, the device is suitable especially preferably for generating a vacuum in the cavity 6. Instead of the upper displacement volume 7a, the cavity 6 is in this case arranged directly above the diaphragm 2 which is arranged so as also to be expandable into the cavity 6. As in FIG. 6, too, a lower displacement volume 7b is arranged below the diaphragm 2 as a result of the formation of a clearance 5b in the lower polymer layer 3. The displacement volume 7b is connected to a supply duct 4a for vacuum generation, the duct 4b being provided for the connection of further pneumatic or microfluidic elements to the cavity 6. Since the microfluidic device according to FIG. 7 is suitable particularly for vacuum generation, there is no provision for expansion of the diaphragm 2 into the cavity 6, but instead only into the lower displacement volume 7b. It thereby becomes possible to have a smaller base area, that is to say a horizontal extent of smaller cross section of the microfluidic device M.

In general, further pneumatically actuable elements can be connected to the cavity 6 via the duct 4b which is connected pneumatically to the cavity 6. By the action of pressure upon the duct 4a and consequently upon the elastic diaphragm 2 and by the expansion of the latter, a corresponding pressure rise takes place in the cavity 6, and it becomes possible to actuate the pneumatically actuable elements which require a correspondingly adapted pressure level, for example a displacement chamber of a diaphragm pump or diaphragm valves.

It is likewise possible to actuate a duct network connected to the cavity, in that a defined volume is displaced within the duct network which can be separated from the cavity 6 by means of a valve. The cavity 6 can thus be "charged" in a similar way to an electrical capacitor and, after the opening of the valve, the duct network can be acted upon with a defined liquid volume. If, for example, a pneumatic resistance of such a duct network is defined as R and the pneumatic capacity of the cavity as C, the time pressure profile of the pressure within the cavity can be described approximately by the formula $$p_2(t) = p_2(t=0)e^{-t/\tau}$$

with the characteristic time constant $\tau = RC$. On account of the strong dependence of the above-defined pneumatic resistance R, for example, upon a radius of the corresponding duct, which is proportional to $1/r^4$ according to Hagen-Poiseuille, the characteristic time constant $\tau$ can be stipulated or adapted over a wide range. Thus, for example for air and typical duct diameters of between 30 μm and 500 μm, values for the characteristic time constant of one second to $10^5$ seconds are possible.

The thickness of a polymer layer of a microfluidic device may in this case amount to between 0.1 mm and 5 mm, in particular to between 0.5 mm and 3 mm. The thickness of an elastic diaphragm may in this case be between 10 μm and 500 μm, in particular between 25 and 300 μm. The volume of a cavity of a microfluidic device may in this case amount to between 1 mm³ and 10 000 mm³, in particular to between 10 mm³ and 1000 mm³, and/or the dimensions of the cavity may in this case amount for the length and/or width of the cavity to between 10 μm and 50 mm, in particular to between 25 μm and 25 mm, and the height of the cavity may in this case amount to between 25 μm and 10 mm, in particular to between 50 μm and 5 mm. The displacement volume 7a, 7b, defined by the limiting means 5a, 5b, may in this case amount to between 0.1 mm³ and 5000 mm³, in particular to between 1 mm³ and 2000 mm³, depending on the desired pressure change.

A microfluidic device M particularly according to FIGS. 1-7 may in this case have lateral dimensions of between 1 mm² and $10^6$ mm², in particular between 100 mm² and $10^4$ mm².

Although the present disclosure was described above by means of preferred exemplary embodiments, it is not restricted to these, but can be modified in many different ways.

The invention claim is:

1. A microfluidic device, comprising:
   at least two layers arranged above one another, wherein at least one stipulated displacement volume is arranged in at least one of the at least two layers;
   an elastic diaphragm arranged between the at least two layers so as to be expandable into the at least one stipulated displacement volume;
   a cavity arranged in a first layer of the at least two layers, and pneumatically connected with the at least one displacement volume; and
   at least one duct arranged in a second layer of the at least two layers, the at least one duct configured to apply an external pressure supplied to the at least one duct to the diaphragm to expand the diaphragm into the at least one displacement volume,
   wherein expansion of the diaphragm into the at least one displacement volume induces a change in pressure in the cavity;
   wherein the diaphragm is configured to expand to at most a maximum expansion into the at least one displacement volume; and
   wherein the microfluidic device is configured such that, when the external pressure applied to the at least one duct is sufficient to expand the diaphragm to the maximum expansion into the at least one displacement volume, the cavity has a pressure that is independent of the external pressure applied to the at least one duct.

2. The microfluidic device as claimed in claim 1, further comprising a limiting mechanism arranged and configured to restrict the at least one displacement volume such that expansion of the diaphragm is limited to the maximum expansion.

3. The microfluidic device as claimed in claim 2, wherein the limiting mechanism is configured as a clearance in at least one of the at least two layers.

4. The microfluidic device as claimed in claim 2, wherein the limiting mechanism is formed by extending a fixing of the diaphragm on at least one of the at least two layers.

5. The microfluidic device as claimed in claim 1, further comprising a connecting duct that pneumatically connects the cavity and the at least one displacement volume.

6. The microfluidic device as claimed in claim 5, wherein the connecting duct is formed by at least one web.

7. The microfluidic device as claimed in claim 1, wherein at least one displacement volume is configured as the at least one duct.

8. The microfluidic device as claimed in claim 3, wherein the clearance includes rounded edges.

9. The microfluidic device as claimed in claim 1, further comprising a covering layer formed at least for the cavity.

10. The microfluidic device as claimed in claim 1, wherein:
at least one of the at least two layers is formed from a polymer; and/or
the diaphragm is formed from at least one of a thermoplastic elastomer and a thermoplastic.

11. A method for producing a microfluidic device, comprising:
arranging a cavity in a first layer of the microfluidic device;
arranging at least one duct in a second layer of the microfluidic device,
arranging a first displacement volume in the first layer of the microfluidic device, and a second displacement volume in the second layer of the microfluidic device; and
arranging an elastic diaphragm between the first and second layers such that the elastic diaphragm is configured to selectively expand into either of the first and second displacement volumes, depending on the action of a pressure applied to the at least one duct;
wherein the at least one duct is configured to selectively apply (i) a first pressure to the diaphragm that acts to expand the diaphragm into the first displacement volume, and (ii) a second pressure to the diaphragm that acts to expand the diaphragm into the second displacement volume, the microfluidic device being configured such that an extent of expansion of the diaphragm into the first displacement volume induces an increase in pressure in the cavity, and such that expansion of the diaphragm into the second displacement volume induces a reduction in pressure in the cavity.

12. The method for producing a microfluidic device as claimed in claim 11, further comprising firmly connecting the at least two layers to one another by at least one of laser irradiation welding, ultrasonic welding, and an adhesive method.

13. The microfluidic device as claimed in claim 1, wherein the microfluidic device is configured to be used as a lab-on-a-chip system.

14. A microfluidic system, comprising:
a plurality of microfluidic devices, each microfluidic device including:
at least two layers arranged above one another, wherein at least one stipulated displacement volume is arranged in at least one of the at least two layers;
an elastic diaphragm arranged between the at least two layers so as to be expandable into the at least one stipulated displacement volume;
a cavity arranged in a first layer of the at least two layers; and
at least one duct arranged in a second layer of the at least two layers, the at least one duct being pneumatically connected to the diaphragm such that pressure in the at least one duct acts to expand the diaphragm into the at least one displacement volume, each microfluidic device configured such that expansion of the at least one diaphragm into the at least one displacement volume induces a change in pressure in the cavity: and
a common external pressure source configured to supply the at least one duct of each of the plurality of microfluidic devices with a common external pressure,
wherein the at least one displacement volume of each microfluidic device respectively defines a different maximum expansion of the corresponding at least one diaphragm such that, when the common external pressure supplied to each of the at least one ducts is sufficient to expand each of the at least one diaphragms to the corresponding maximum expansion into each of the at least one displacement volumes, the cavities of the plurality of microfluidic devices have different pressures corresponding to the different maximum expansions of the at least one diaphragms.

15. The microfluidic device as claimed in claim 3, wherein the limiting mechanism is configured as a stop.

16. The microfluidic device as claimed in claim 10, wherein the at least one of the at least two layers is formed from a thermoplastic.

17. The method of claim 11, wherein:
the first displacement volume is configured and arranged to define a first maximum expansion of the diaphragm;
the second displacement volume is configured and arranged to define a second maximum expansion of the diaphragm; and
the microfluidic device is configured such that, when the pressure applied by the duct is sufficient to expand the diaphragm to either the first or second maximum expansion into the first or second displacement volume respectively, the cavity has a pressure that is independent of the pressure applied by the duct.

18. The microfluidic device as claimed in claim 1, wherein the cavity is in communication with a finite volume so as to enable pneumatic actuation of the microfluidic device.

* * * * *